(12) United States Patent
Horibe et al.

(10) Patent No.: US 11,908,723 B2
(45) Date of Patent: Feb. 20, 2024

(54) SILICON HANDLER WITH LASER-RELEASE LAYERS

(71) Applicant: INTERNATIONAL BUSINESS MACHINES CORPORATION, Armonk, NY (US)

(72) Inventors: Akihiro Horibe, Yokohama (JP); Qianwen Chen, Chappaqua, NY (US); Risa Miyazawa, Isehara (JP); Michael P. Belyansky, Halfmoon, NY (US); John Knickerbocker, Monroe, NY (US); Takashi Hisada, Hachiouji (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 193 days.

(21) Appl. No.: 17/541,946

(22) Filed: Dec. 3, 2021

(65) Prior Publication Data

US 2023/0178404 A1 Jun. 8, 2023

(51) Int. Cl.
*H01L 21/68* (2006.01)
*H01L 21/683* (2006.01)

(52) U.S. Cl.
CPC ........ *H01L 21/681* (2013.01); *H01L 21/6835* (2013.01); *H01L 2221/6834* (2013.01); *H01L 2221/68381* (2013.01)

(58) Field of Classification Search
CPC ............... H01L 21/681; H01L 21/6835; H01L 2221/6834; H01L 2221/68381
USPC .......................................................... 438/16
See application file for complete search history.

(56) References Cited

U.S. PATENT DOCUMENTS

| | | | | |
|---|---|---|---|---|
| 6,100,166 A | * | 8/2000 | Sakaguchi | H01L 21/304 438/455 |
| 6,221,738 B1 | * | 4/2001 | Sakaguchi | H01L 21/2007 438/455 |
| 6,664,169 B1 | * | 12/2003 | Iwasaki | C25D 11/32 257/E21.216 |
| 6,682,990 B1 | * | 1/2004 | Iwane | H01L 21/6835 438/455 |

(Continued)

FOREIGN PATENT DOCUMENTS

| | | |
|---|---|---|
| CN | 105765710 A | 7/2016 |
| WO | 2016071788 A1 | 5/2016 |

(Continued)

OTHER PUBLICATIONS

Refractive index and extinction coefficient of materials (Year: 2002).*

(Continued)

*Primary Examiner* — Vu A Vu
(74) *Attorney, Agent, or Firm* — Tutunjian & Bitetto, P.C.; Robert Richard Aragona (57) ABSTRACT

Handler wafers and methods of handling a wafer include positioning a handler, which is attached to a wafer by a bonding layer that comprises a debonding layer, an optical enhancement layer, and an anti-reflection layer. The handler is debonded from the wafer using a laser that emits laser energy at a wavelength that is absorbed by the debonding layer and that is confined to the debonding layer by the optical enhancement layer, such that the material of the debonding layer ablates when exposed to the laser energy to release the wafer.

24 Claims, 5 Drawing Sheets

(56) References Cited

U.S. PATENT DOCUMENTS

| | | | | |
|---|---|---|---|---|
| 6,814,832 B2* | 11/2004 | Utsunomiya | ....... | H01L 27/1266 156/289 |
| 6,953,735 B2* | 10/2005 | Yamazaki | ............ | H10K 59/131 438/457 |
| 7,332,381 B2* | 2/2008 | Maruyama | ............ | H10K 71/00 438/455 |
| 7,468,308 B2* | 12/2008 | Shimoda | ........... | H01L 21/76259 438/455 |
| 7,648,862 B2* | 1/2010 | Maruyama | .......... | H01L 27/1266 438/455 |
| 7,745,252 B2* | 6/2010 | Suzuki | ................... | H10K 71/80 257/E51.011 |
| 7,825,002 B2* | 11/2010 | Takayama | ............ | H10K 59/124 257/E21.567 |
| 7,897,476 B2* | 3/2011 | Yamazaki | ............... | H01L 21/84 438/149 |
| 8,173,519 B2* | 5/2012 | Morisue | ............ | H01L 29/78633 257/E21.567 |
| 8,236,668 B2* | 8/2012 | Ohnuma | ............ | H01L 27/1266 257/E21.211 |
| 8,530,253 B2* | 9/2013 | Shin | ...................... | H10K 50/844 438/457 |
| 9,029,238 B2 | 5/2015 | Andry et al. | | |
| 9,111,983 B1 | 8/2015 | Ginter et al. | | |
| 9,184,221 B2* | 11/2015 | Jinbo | ...................... | H01L 28/40 |
| 9,269,561 B2* | 2/2016 | Dang | ................ | H01L 21/02002 |
| 9,401,303 B2 | 7/2016 | Cheng et al. | | |
| 9,636,782 B2* | 5/2017 | Dang | ................. | G01R 31/2607 |
| 9,847,243 B2* | 12/2017 | Carre | ................... | H01L 21/6835 |
| 9,966,260 B1 | 5/2018 | Chan et al. | | |
| 10,112,377 B2* | 10/2018 | Fujii | ................... | B32B 38/0008 |
| 10,118,250 B1 | 11/2018 | Budd et al. | | |
| 10,174,229 B2 | 1/2019 | Allen et al. | | |
| 10,224,229 B2 | 3/2019 | Andry et al. | | |
| 10,490,525 B1 | 11/2019 | Chen et al. | | |
| 10,910,451 B2* | 2/2021 | Yang | .................... | H10K 77/111 |
| 10,985,204 B2* | 4/2021 | Von Känel | .......... | H01L 27/1469 |
| 11,637,009 B2* | 4/2023 | Yamazaki | .............. | B23K 26/53 134/1 |
| 2011/0290413 A1 | 12/2011 | Dang et al. | | |
| 2013/0087959 A1 | 4/2013 | Tran et al. | | |
| 2014/0144593 A1* | 5/2014 | Dang | ................ | H01L 21/67092 428/688 |
| 2015/0035173 A1 | 2/2015 | Dang et al. | | |
| 2015/0083343 A1* | 3/2015 | Fujii | ................... | B32B 38/0008 156/753 |
| 2016/0104622 A1* | 4/2016 | Oefner | ............. | H01L 21/02002 438/459 |
| 2017/0125268 A1 | 5/2017 | Dang et al. | | |
| 2017/0170048 A1 | 6/2017 | Tran-Quinn et al. | | |
| 2017/0358554 A1 | 12/2017 | Chen et al. | | |
| 2019/0088481 A1 | 3/2019 | Budd et al. | | |
| 2019/0194506 A1 | 6/2019 | Gelorme et al. | | |
| 2020/0083082 A1 | 3/2020 | Dang et al. | | |
| 2020/0098638 A1 | 3/2020 | Dang et al. | | |
| 2020/0161230 A1 | 5/2020 | Knickerbocker et al. | | |
| 2020/0176297 A1 | 6/2020 | Andry et al. | | |
| 2021/0349281 A1* | 11/2021 | Augst | ..................... | G02B 1/11 |

FOREIGN PATENT DOCUMENTS

| | | |
|---|---|---|
| WO | 2016151485 A1 | 9/2016 |
| WO | 2021130136 A1 | 7/2021 |

OTHER PUBLICATIONS

Dang, Bing, et al. "Feasibility Study of Si Handler Debonding by Laser Release", 2016 IEEE 66th Electronic Components and Technology Conference. May 31, 2016, pp. 1671-1677.

International Search Report issued in corresponding PCT Application Serial No. PCT/IB2022/058304 dated Dec. 21, 2022, pp. 1-7.

* cited by examiner

SILICON HANDLER WITH LASER-RELEASE LAYERS

BACKGROUND

The present invention generally relates to semiconductor device fabrication, and, more particularly, to wafer handlers with laser-release layers.

Three-dimensional chip integration helps to improve chip area efficiency by stacking components on top of one another. Among other things, this stacking can decrease chip complexity and improve performance, for example by shortening signal propagation times. Stacking However, positioning the different layers of the three-dimensional chip relative to one, before bonding them together, another can be challenging. In some cases, where the wafer to be placed is particularly thin, moving the wafer without support can result in damage. Handlers may therefore be used to provide structural support to the wafer. Such a handler may be adhered to one side of the wafer while the wafer is moved, and may then be debonded and removed to provide an opportunity for further processing.

This debonding process may include the use of a laser that passes through the material of the handler and that heats a debonding layer. When the debonding layer is sufficiently heated, it may sublimate and release the wafer. However, the absorption of the laser energy within the debonding layer may be very low (e.g., about 5%). High-power lasers need to be used, which increases the cost of the debonding process. Furthermore, with only small amounts of laser energy actually heating the debonding layer, the remaining laser energy passes through to be absorbed by surrounding materials and the environment. This can cause damage to the wafer or other circuitry if the laser energy is absorbed by an unintended structure.

SUMMARY

A method for handling a wafer includes positioning a handler, which is attached to a wafer by a bonding layer that comprises a debonding layer, an optical enhancement layer, and an anti-reflection layer. The handler is debonded from the wafer using a laser that emits laser energy at a wavelength that is absorbed by the debonding layer and that is confined to the debonding layer by the optical enhancement layer, such that the material of the debonding layer ablates when exposed to the laser energy to release the wafer.

A method for handling a wafer includes bonding a handler to a wafer using a bonding layer that comprises a debonding layer, an optical enhancement layer, and an anti-reflection layer. The handler is positioned. The handler is debonded from the wafer using a laser that emits laser energy at a wavelength that is absorbed by the debonding layer and that is confined to the debonding layer by the optical enhancement layer, such that the material of the debonding layer ablates when exposed to the laser energy to release the wafer.

A handler wafer includes a handler layer formed from a material that is transparent at a wavelength of light. A bonding layer includes a debonding layer and an optical enhancement layer. The debonding layer absorbs the wavelength of light, being formed from a material that has a real index of refraction greater than 3.0 and an extinction coefficient greater than 5.0 at the wavelength. The optical enhancement layer is formed from a material that is transparent at the wavelength and that has an index of refraction greater than 2.0, to confine energy at the wavelength of light to the debonding layer.

A handler wafer includes a handler layer formed from a material that is transparent at a wavelength of light. A bonding layer includes a debonding layer that absorbs the wavelength of light, being formed from a material that has a real index of refraction greater than 3.0 and an extinction coefficient greater than 5.0 at the wavelength. An optical enhancement layer of the bonding layer is formed from a material that is transparent at the wavelength and that has an index of refraction greater than 2.0, to confine energy at the wavelength of light to the debonding layer.

A handler wafer includes a handler layer formed from silicon. A bonding layer includes a debonding layer, an optical enhancement layer, an optical boundary layer, and an antireflective layer. The debonding layer absorbs a wavelength of light from a debonding laser, selected from a range between 1200 nm and 2500 nm, being formed from a material selected from the group consisting of magnesium, iron, nickel, rhodium, palladium, platinum, and lutetium. An optical enhancement layer is formed from a material selected from the group consisting of amorphous silicon, amorphous germanium, and polycrystalline silicon, to confine laser energy at the wavelength of light to the debonding layer. An optical boundary layer is on an opposite side of the debonding layer from the handler layer, to reflect the wavelength of light into the debonding layer. An antireflective layer is between the optical enhancement layer and the handler layer.

Some embodiments may include a debonding layer that includes a metallic material that is selected from the group consisting of magnesium, iron, nickel, rhodium, palladium, platinum, and lutetium.

Some embodiments may include a debonding layer that includes a metal that has an extinction coefficient at the laser wavelength that is at least 5.

Some embodiments may include an optical enhancement layer that is formed from a material selected from the group consisting of amorphous silicon, amorphous germanium, and polycrystalline germanium.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

When integrating multiple chips in a three-dimensional arrangement, the chips are carefully and cleanly moved and positioned with respect to one another for fabrication processing and the creation of functional contacts between structures. The wafers may be handled with a variety of structures. For example, a handler layer may be formed from any appropriate material, such as silicon, and may be bonded to the wafer that is to be moved. In this way, damage to the wafer may be prevented, as the handler provides structural support to the device wafer. This is of particular concern when the substrate of the device wafer is thinned, which can weaken the wafer with respect to transverse forces.

The handling process not only includes the mechanism by which the handler layer is bonded to the wafer, but also how the handler is debonded to release the wafer. For example, a laser may be used to remove a debonding layer. The material of the debonding layer and the wavelength and power of the laser may be selected to selectively remove the bonding layer, without damaging the wafer, for example by causing the material of the debonding layer to sublimate. A debonding layer may be formed from a material with an appropriate stability at working temperatures, melting point, index of refraction, and absorption for the laser wavelength. The selection of the debonding layer material may provide for low-energy laser removal with a small spot size, and may further provide high throughput with a low risk of damage to the circuits of the wafer.

In particular, the bonding/debonding layer may include multiple constituent layers. One such constituent layer may be a bonding layer, which provides adhesion between the handler and the wafer. Another such constituent layer may be a debonding layer formed from a metal or film, between the bonding layer and the handler. The debonding layer may be designed to release the wafer when an appropriate laser is applied, for example by melting or sublimating the material of the debonding layer. When the debonding layer is completely removed, the handler may be lifted away from the wafer without causing damage.

The debonding layer may be formed from a metal or film material that has a high refractive index (e.g., greater than about 3.0) and that has an appropriate extinction coefficient (e.g., K between about 5 and about 10) at mid-infrared laser wavelengths (e.g., between about 1200 nm and about 6000 nm). A laser wavelength is selected that is not absorbed by the material of the handler, allowing the debonding to be performed by applying the laser light through the material of the handler. Additionally, a debonding enhancement layer may be used that has a high refractive index (e.g., greater than about 2.0) and high transparency (e.g., K close to zero) to the mid-infrared laser wavelength. The complex index of refraction of the debonding layer and surrounding materials help to confine the laser energy within the debonding layer, where a large percentage of the energy is absorbed and is used to facilitate debonding. The details of such materials are described in greater detail below.

Using these materials, the optical absorbance of the debonding laser light is concentrated within the debonding metal or film layer. This increases the efficiency of the debonding process, making it possible to use lower-power lasers. Additionally, because the absorption of the laser light's energy is concentrated within the debonding layer, less heat is generated within the handler and the wafer.

Figure 1:
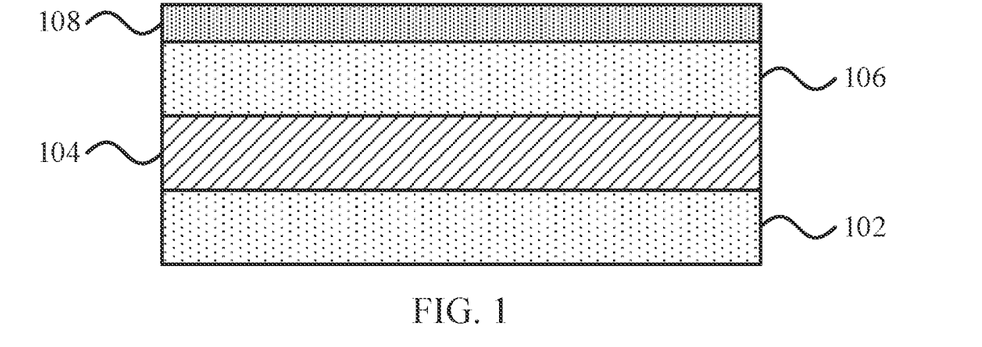
FIG. 1 is a cross-sectional diagram of an arrangement of layers for handling a wafer, including a bonding/debonding layer that can release a wafer when a debonding portion is removed using the application of laser energy, in accordance with an embodiment of the present invention.

Referring now to FIG. 1, a cross-sectional view is shown of a handler 106 bonded to a wafer 102. While it is specifically contemplated that the wafer 102 may be an integrated circuit formed on a semiconductor substrate, such as silicon, it should be understood the wafer may be formed from any appropriate materials and may include any appropriate devices. For example, the wafer 102 may include active circuit components, such as transistors, and may further include passive circuit components, such as capacitors, inductors, and conductive interconnects.

The handler 106 may similarly be formed from any appropriate material, with silicon being specifically contemplated. The handler 106 may further have an antireflective layer 108, which may be formed from silicon nitride or another material with an appropriate index of refraction and transparency. The handler 106 is formed from a material that is transparent to the wavelength of light that is used for debonding.

A multi-layer bonding layer 104 is shown between the wafer 102 and the handler 106. The bonding layer 104 will be described in greater detail below. The layers that make up the bonding layer 104 are selected to concentrate laser light absorption within a debonding layer. The bonding layer 104 thus performs a dual function, first in providing adhesion between the wafer 102 and the handler 106, and second in decoupling the two structures when the wafer 102 has been maneuvered into position when laser light is applied.

During semiconductor fabrication processes, the use of a handler 106 makes it possible to greatly improve the efficiency and speed of chip packaging. Machinery can be configured to pick up the wafer 102 by the handler 106, for example by applying suction or a mechanical grip, making it possible to automatically and precisely maneuver the wafer during the fabrication process. This is of particular use when mounting one wafer onto another, for example during three-dimensional integrated circuit packaging. In particular, during a flip-chip process, integrated circuits may be fabricated on a wafer. The wafer may subsequently be cut into chips, and these chips may be flipped over and bonded to another chip. This process will be described in greater detail below.

Figure 2:
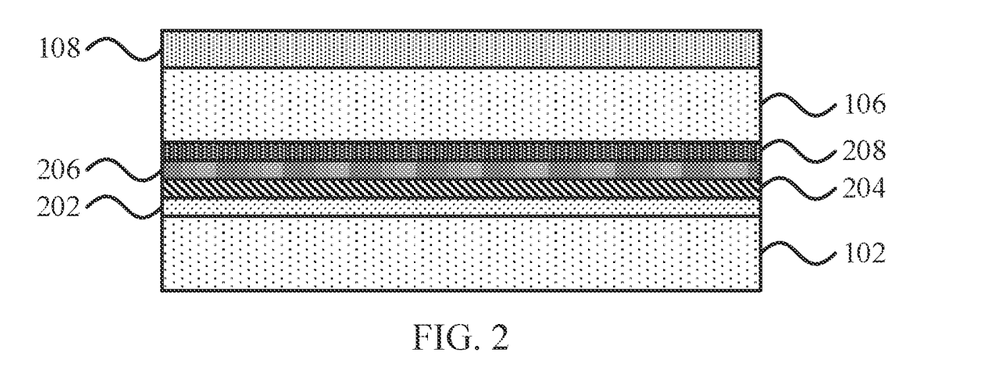
FIG. 2 is a cross-sectional diagram of an arrangement of layers for handling a wafer, including a multi-layer bonding/debonding layer that can release a wafer when a debonding portion is removed using the application of laser energy, in accordance with an embodiment of the present invention.

Referring now to FIG. 2, a cross-sectional view is shown of a handler 106 bonded to a wafer 102, with additional detail on the bonding layer 104. The bonding layer 104 may include a first optical boundary layer 202, a debonding layer 204, a second optical boundary layer 206, and an antireflective coating layer 208. Each of these layers may have a thickness in the range between about 20 nm and about 5 μm.

The optical boundary layers 202 and 206 and the antireflective coating layer 208 each perform functions that relate to controlling reflections between layers, and these functional designations are not intended to be interpreted strictly. In particular, a given layer may provide an antireflective function for one layer, and may provide an optical boundary function for another layer, based on the respective differences in index of refraction.

While one particular arrangement of layers is described with respect to FIG. 2, it should be understood that other layers may be used in addition to, or instead of, the layers that are depicted. For example, the bonding layer 104 may include, in order from the handler layer to the wafer, a first optional antireflective coating, an optional optical boundary layer, a second optional antireflective coating, a debonding layer, and an optical boundary layer.

The first optical boundary layer 202 may provide adhesion to the wafer 102 and may be formed from a material having an index of refraction with a real component $n_{real} < 2.0$. For example, the material of the first optical boundary layer 202 may be a polyimide with a complex index of refraction of about n=1.6+0i, where the real part $n_{real}$ is the index of refraction and where the imaginary part is the extinction coefficient K of the material at the wavelength in question. Alternatively, silicon dioxide may be used as the material of the first optical boundary layer 202, with a complex index of refraction of about n=1.5+0i. The index of refraction is selected to be low, to increase reflections at the interface between the debonding layer 204 and the first optical boundary layer 202. Thus, as laser light passes through the debonding layer 204, some energy is absorbed, but some passes through, only to be reflected back into the debonding layer 204 at the first optical boundary layer 202.

The debonding layer 204 is formed on the first optical boundary layer 202. The debonding layer 204 may be formed from a material having a complex index of refraction preferably having a real component of $n_{real} > 3.0$ and an imaginary component of $\kappa > 5.0$ at at least one appropriate laser wavelength, for example in the range between 1200 nm and 6000 nm. Exemplary materials for the debonding layer may be selected from those shown in Table 1. These materials have good complex index of refraction values for at least one wavelength range, including both the real part and the absorbance part.

TABLE 1

| Material | Index of refraction at 1200 nm | | Index of refraction at 1500 nm | | Index of refraction at 2000 nm | |
|---|---|---|---|---|---|---|
| | n | K | n | K | n | K |
| Magnesium | 2.7836 | 12.332 | 7.2536 | 15.209 | 7.1988 | 9.1847 |
| Iron | 3.1822 | 5.4909 | 3.0702 | 6.6994 | 3.0056 | 9.0376 |
| Nickel | 3.0763 | 6.7413 | 3.1239 | 7.866 | 3.0976 | 10.326 |
| Rhodium | 3.7168 | 8.5141 | 3.6355 | 10.031 | 3.8285 | 13.126 |
| Palladium | 3.4558 | 7.3899 | 3.8154 | 8.5835 | 4.128 | 10.662 |
| Platinum | 4.7446 | 8.1653 | 5.6406 | 8.3367 | 4.8397 | 9.691 |
| Lutetium | 3.1044 | 4.5883 | 3.1694 | 5.4249 | 3.4391 | 7.3115 |

Additional materials that may be used include those shown in Table 2. These materials have strong absorption values, but relatively low real components of their indices of refraction, or a high real component and low absorption values.

TABLE 2

| Material | Index of refraction at 1200 nm | | Index of refraction at 1500 nm | | Index of refraction at 2000 nm | |
|---|---|---|---|---|---|---|
| | n | k | n | k | n | k |
| Beryllium | 3.1021 | 4.346 | 2.7983 | 5.3941 | 2.457 | 7.439 |
| Aluminum | 1.3014 | 11.503 | 1.4639 | 14.711 | 2.1427 | 19.819 |
| Titanium | 4.9660 | 3.9405 | 5.2052 | 4.4024 | 5.3495 | 4.7147 |
| Chromium | 4.2709 | 4.1511 | 4.0328 | 4.5835 | 3.5854 | 5.8711 |
| Manganese | 4.098 | 4.751 | 4.78 | 5.08 | 5.769 | 5.61 |
| Cobalt | 5.178 | 4.5708 | 3.8277 | 5.1263 | 2.7638 | 7.6934 |

Additional materials that may be used include those shown in Table 3. These materials are similar to Table 2 materials, but have a high boiling point.

TABLE 3

| Material | Index of refraction at 1200 nm | | Index of refraction at 1500 nm | | Index of refraction at 2000 nm | |
|---|---|---|---|---|---|---|
| | n | k | n | k | n | k |
| Tungsten | 2.7899 | 5.1496 | 2.34 | 6.6453 | 2.1162 | 9.6315 |
| Zirconium | 4.51 | 3.936 | 4.819 | 4.182 | 5.183 | 4.5860 |

Some materials, such as tungsten and zirconium may have a relatively high boiling point (e.g., above 4000° C.) which may make their use impractical, as the temperature needed to debond the wafer may damage nearby components. Aluminum, meanwhile, has a relatively high solubility into silicon, which affects the optical properties of such a layer and decreases the absorption of laser light energy. In contrast, materials like nickel and platinum absorb large amounts of the laser light, even with relatively small thicknesses (e.g., around 500 Å).

Alloys of the materials described herein may also be used, to achieve a desired complex index of refraction. Similarly, alloys of the metals described herein with other metals may be used as appropriate. Additionally, the debonding layer 204 may be made up of multiple layers of differing appropriate materials. The selection of the debonding layer 204 makes use of two different material properties to improve absorption of laser light energy. Additional criteria for selection may include compatibility with the semiconductor line, to avoid contamination of the materials of the wafer. The selection may also be made to improve storage properties, to prevent corrosion or oxidation of the debonding layer 204.

In some cases, the debonding layer 204 may include a polymer film with a filler, selected from one or more of the materials described herein. For example, the filler may include particles of the metal, particles of a metal alloy, carbon particles with metal coatings, and non-metal particles. The material of the filler is selected to, along with the polymer material of the film, absorb laser energy to be removed during the debonding process.

The second optical enhancement layer 206 may be formed on the debonding layer 204, to decrease reflection of light from the interface of the debonding layer 204. Because reflections occur at boundaries between materials, and increase as the mismatch between indices of refraction of the interfacing layers increases, a layer having an intermediate index of refraction can decrease the amount of laser light energy that is reflected away from the debonding layer 204.

An anti-reflective coating 208 may provide an additional material with an intermediate index of refraction. For example, the anti-reflective coating 208 may be formed from silicon dioxide, with a complex index of refraction of 1.5+0i at the relevant wavelengths.

The layers of the multi-layer bonding layer may be formed by sequential deposition processes. Starting with the handler 106, the first optical boundary layer, the anti-reflective coating 208 and the second optical boundary layer 206 may be formed on the handler surface by respective depositions using any appropriate process or processes, such as physical vapor deposition (PVD) or chemical vapor deposition (CVD). The debonding layer 204 may similarly be formed using PVD or CVD. The first optical boundary layer 202, which may be formed from polyimide, may be deposited using a spin coating process. If the wafer 102 is an active silicon wafer, the polyimide may function as an adhesive. If the wafer 102 is a passive redistribution layer, then the wafer 102 may be formed directly on the polyimide of the first optical boundary layer 202, so that there need not be a separate step of bonding to the wafer 102.

Figure 3:
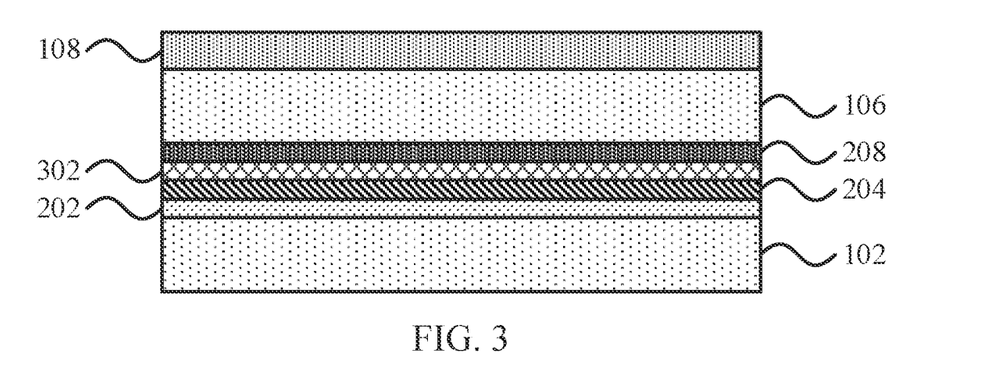
FIG. 3 is a cross-sectional diagram of an arrangement of layers for handling a wafer, including a multi-layer bonding/debonding layer that can release a wafer when a debonding portion is removed using the application of laser energy, in accordance with an embodiment of the present invention.

Referring now to FIG. 3, a cross-sectional view is shown of a handler 106 bonded to a wafer 102, with additional detail on the bonding layer 104. Some embodiments may, in addition to the use of a debonding layer 204 that has a high index of refraction, use a second optical boundary layer 302 that also has a high index of refraction.

Exemplary materials for this layer include amorphous silicon, with a complex index of refraction of 3.5+0i at the wavelengths in question, and amorphous or polycrystalline germanium, with a complex index of refraction of 4.0+0i at the wavelengths in question. As compared to the use of silicon nitride for this layer, the use of amorphous silicon can boost laser light absorption in the debonding layer 204 from 60%-80% to 90%-100%.

Figure 4:
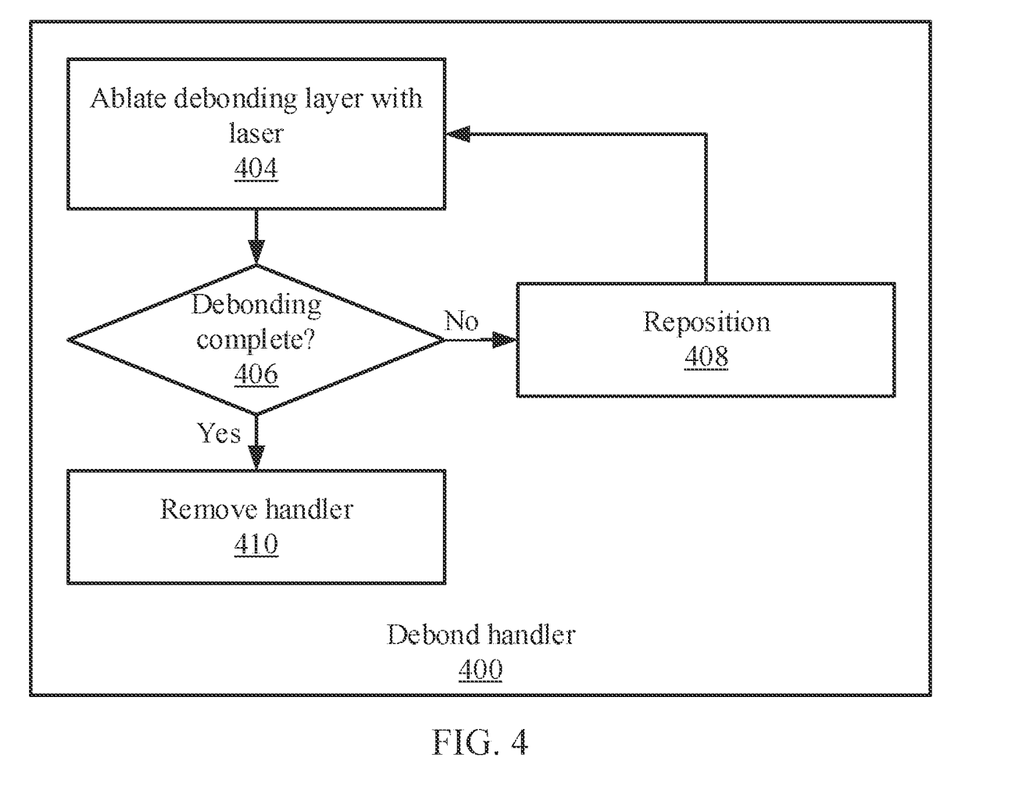
FIG. 4 is a block/flow diagram of a method for debonding a handling layer from a wafer by ablating a debonding layer with a laser, in accordance with an embodiment of the present invention.

Referring now to FIG. 4, a method of debonding 400 a handler 106 from a wafer 102 is shown. This step may be performed after the wafer 102 has been positioned and connected to another chip, or may be performed in preparation for an intermediate process, where the underside of the wafer 102 is to be processed. This positioning may include alignment with another chip, for example a carrier chip, and may further include a bonding process to attach the wafer 102 to the other chip. Such a bonding process may include, for example, the reflow of solder bumps and the addition of an adhesive underfill to provide structural support for the electrical connections.

Block 404 ablates a part of the debonding layer 204 using a laser of an appropriate wavelength. This ablation can be performed using a short-duration laser pulse over a focused area. When a wavelength is used that is absorbed by the debonding layer 204, the energy of the laser light is transferred to the material of the debonding layer 204 in the focused area, causing a localized change to the material. This change may be regarded as a sublimation of the material, which converts the material directly to a gaseous or plasma state, without first melting. The penetration of thermal energy can thereby be localized to the debonding layer 204, with the resulting temperature increase dropping off quickly in neighboring layers.

In this manner, the debonding layer 204 can be selectively removed from between the wafer 102 and the handler 106 without causing thermal damage to the wafer 102. Each firing of the laser will remove material within the laser spot area. The ablation may then be repeated in a scanning pattern to completely remove the debonding layer 204. Thus, block 406 determines whether the debonding is complete, for example by determining that the entirety of the debonding layer 204 has been exposed to a laser light pulse. If not, block 408 repositions the laser relative to the debonding layer 204, so that a new region is exposed to the laser light spot, and block 404 repeats the ablation in the new region by firing another laser pulse. Once the debonding is complete in block 406, block 410 removes the handler 106 from the wafer 102. Any remaining material of the adhesive layer 202 may be dissolved using a solvent.

Figure 5:
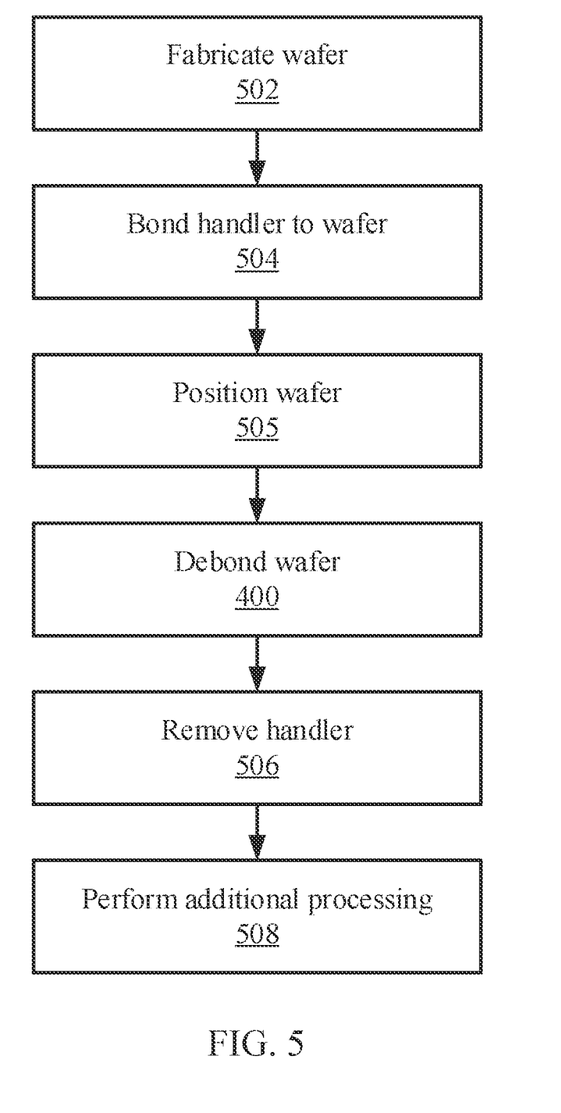
FIG. 5 is a block/flow diagram of a method for manipulating a wafer using a handler that can be selectively debonded using laser energy, in accordance with an embodiment of the present invention.

Referring now to FIG. 5, a method of integrated circuit fabrication with the use of a handler is shown. Block 502 uses one or more fabrication processes to create a wafer 102 with an integrated circuit. For example, block 502 may include a series of depositions and etches to create circuit components, including active components like transistors and passive components like interconnects, capacitors, and inductors. The wafer 102 may include multiple layers, including active device layers and interconnect layers.

A handler 106 is bonded to the wafer 102 using bonding layer 104 in block 504. As noted above, the bonding layer 104 may include multiple distinct layers with beneficial functional and optical properties, which may be formed on the handler 106. Bonding may be performed by adhering the bonding layer 104 to the wafer 102.

Block 505 positions the wafer 102. This positioning may include maneuvering the wafer 102 with respect to another structure, such as a chip or a second wafer. Positioning may also include transferring the wafer 102 from one processing location to another, for example maneuvering the wafer 102 to another machine for further processing. Positioning may also include flipping the wafer over, to expose an underside of the wafer 102. Positioning may be performed by, e.g., picking up the handler 106 or the wafer 102 using a vacuum.

As described above, once the wafer 102 has been positioned in block 505, then block 400 may be used to debond the wafer 102 from the handler 106. The handler 106 is removed in block 506, and block 508 performs any additional processing that may be needed. For example, the wafer 102 may be further processed, for example to form additional structures, to process the substrate of the wafer 102, or to bond another structure to the wafer 102.

Figure 6:
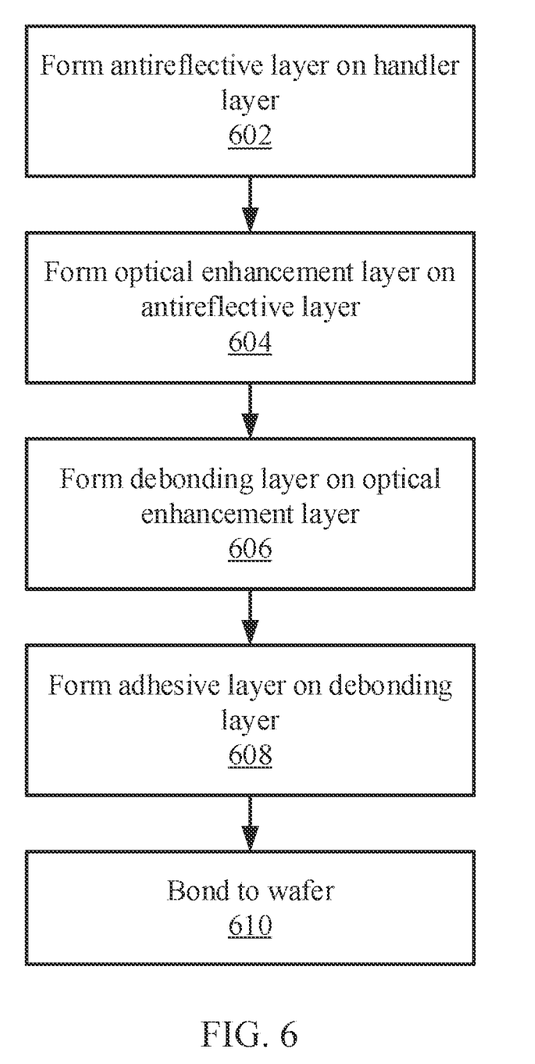
FIG. 6 is a block/flow diagram of a method for forming a handler that includes a debonding layer formed form a material that is selected to improve absorption of laser energy for the purpose of debonding a wafer, in accordance with an embodiment of the present invention.

Referring now to FIG. 6, a method of forming a handler is shown. Block 602 forms an antireflective layer 208 on a handler layer 106, for example using a CVD or PVD process. Block 604 forms an optical enhancement layer 206 on the antireflective layer 208, and block 606 forms the debonding layer 204 on the optical enhancement layer 206, again using a CVD or PVD process. Block 608 then forms the optical barrier layer 202 on the debonding layer 204, for example using a spin coating process. At this point, block 610 can bond the handler 106 to the wafer 102, for example by flipping the handler 106 over and pressing it against the wafer 102 until the material of the optical barrier layer 202 cures.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering.

Figure 7:
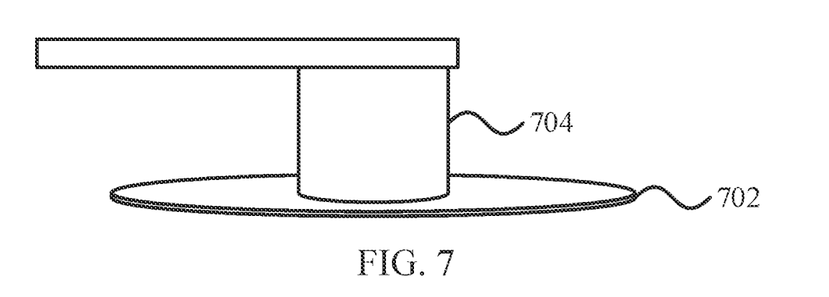
FIG. 7 is a diagram of a wafer handling system, including a manipulator that makes contact with a handler bonded to the wafer and that maneuvers and positions the wafer for processing, in accordance with an embodiment of the present invention.

Referring now to FIG. 7, an apparatus for handling a wafer is shown. A wafer 702, which may include a handler layer such as that described above, is maneuvered using a vacuum manipulator 704. The handler layer provides rigidity to the wafer 702, which might otherwise buckle, crack, or break under the pressure of the vacuum manipulator 704 or the forces involved in moving the wafer 702 from one location to the next.

Although the use of a vacuum manipulator 704 is specifically contemplated, it should be understood that the wafer handling system described herein can be used to position a wafer using any type of manipulator, including any kind of manual or automated gripping apparatus. The manipulator 704 may make contact with a handler side of the wafer 702, to prevent damage to potentially sensitive surface components of the wafer 702.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other vise. It will be further understood that the terms "comprises," "comprising," "includes" and/or "ding," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below." "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a silicon handler with laser-release layers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for handling a wafer, comprising:
positioning a handler, which is attached to a wafer by a bonding layer that comprises a debonding layer, an optical enhancement layer, an optical boundary layer, and an anti-reflection layer; and
debonding the handler from the wafer using a laser that emits laser energy at a wavelength that is absorbed by the debonding layer, that is confined to the debonding layer by the optical enhancement layer, and that is reflected back to the debonding layer by the optical boundary layer, such that the material of the debonding layer ablates when exposed to the laser energy to release the wafer.

2. The method of claim 1, wherein the debonding layer includes a metallic material that is selected from the group consisting of magnesium, iron, nickel, rhodium, palladium, platinum, and lutetium.

3. The method of claim 1, wherein the debonding layer includes a metallic material that is selected from the group consisting of beryllium, titanium, chromium, manganese, and cobalt.

4. The method of claim 1, wherein the debonding layer includes a metallic material that is selected from the group consisting of zirconium, niobium, tungsten, and rhenium.

5. The method of claim 1, wherein the debonding layer includes a metal that has an extinction coefficient at the wavelength of at least 5.

6. The method of claim 1, wherein the metal of the debonding layer has an extinction coefficient at the wavelength of at least 10.

7. The method of claim 1, wherein the wavelength is selected from a range between 1200 nm and 6000 nm.

8. The method of claim 7, wherein the wavelength is selected from a range between 1200 nm and 2500 nm.

9. The method of claim 1, wherein the optical enhancement layer is formed from a material selected from the group consisting of amorphous silicon, amorphous germanium, and polycrystalline germanium.

10. A method for handling a wafer, comprising:
bonding a handler to a wafer using a bonding layer that comprises a debonding layer, an optical enhancement layer, an optical boundary layer, and an anti-reflection layer;
positioning the handler; and
debonding the handler from the wafer using a laser that emits laser energy at a wavelength that is absorbed by the debonding layer, that is confined to the debonding layer by the optical enhancement layer, and that is reflected back to the debonding layer by the optical boundary layer, such that the material of the debonding layer ablates when exposed to the laser energy to release the wafer.

11. The method of claim 10, wherein bonding the handler to the wafer includes applying an adhesive layer to the bonding layer.

12. The method of claim 11, wherein the adhesive layer is a polyimide layer.

13. A handler wafer, comprising:
a handler layer formed from a material that is transparent at a wavelength of light;
a bonding layer that includes:
a debonding layer that absorbs the wavelength of light, being formed from a material that has a real index of refraction greater than 3.0 and an extinction coefficient greater than 5.0 at the wavelength;
an optical enhancement layer being formed from a material that is transparent at the wavelength and that has an index of refraction greater than 2.0, to confine an energy at the wavelength of light to the debonding layer; and
an optical boundary layer positioned on an opposite side of the debonding layer from the handler layer that reflects the energy at the wavelength of light back to the debonding layer.

14. The handler wafer of claim 13, wherein the debonding layer includes a metallic material that is selected from the group consisting of magnesium, iron, nickel, rhodium, palladium, platinum, and lutetium.

15. The handler wafer of claim 14, wherein the metal of the debonding layer has an extinction coefficient at the wavelength of at least 10.

16. The handler wafer of claim 13, wherein the wavelength is selected from a range between 1200 nm and 6000 nm.

17. The handler wafer of claim 16, wherein the wavelength is selected from a range between 1200 nm and 2500 nm.

18. The handler wafer of claim 13, wherein the optical enhancement layer is formed from a material selected from the group consisting of amorphous silicon, amorphous germanium, and polycrystalline germanium.

19. The handler wafer of claim 13, further comprising an antireflective layer between the optical enhancement layer and the handler layer.

20. The handler wafer of claim 13, wherein the handler layer is formed from a semiconductor material that includes silicon.

21. A handler wafer, comprising:
a handler layer formed from a material that is transparent at a wavelength of light;
a bonding layer that includes:
a debonding layer that absorbs the wavelength of light, being formed from a material that has a real index of refraction greater than 3.0 and an extinction coefficient greater than 5.0 at the wavelength;
an optical enhancement layer being formed from a material that is transparent at the wavelength and that has an index of refraction greater than 2.0, to confine an energy at the wavelength of light to the debonding layer; and
an optical boundary layer being formed from a material that has a real index of refraction less than 2.0, positioned on an opposite side of the debonding layer from the handler layer that reflects the energy at the wavelength of light back to the debonding layer.

22. The handler wafer of claim 21, wherein the bonding layer further comprises an adhesive layer.

23. The handler wafer of claim 22, wherein the adhesive layer is formed from polyimide.

24. A handler wafer, comprising:
a handler layer formed from silicon;
a bonding layer that includes:
a debonding layer that absorbs a wavelength of light from a debonding laser, selected from a range between 1200 nm and 2500 nm, being formed from a metallic material that is selected from the group consisting of magnesium, iron, nickel, rhodium, palladium, platinum, and lutetium;
an optical enhancement layer being formed from a material selected from the group consisting of amorphous silicon, amorphous germanium, and polycrystalline silicon, to confine a laser energy at the wavelength of light to the debonding layer;
an optical boundary layer on an opposite side of the debonding layer from the handler layer, to reflect the laser energy at the wavelength of light into the debonding layer and to provide adhesive attachment to a wafer; and
an antireflective layer between the optical enhancement layer and the handler layer.

* * * * *